United States Patent [19]
Konogi

[11] Patent Number: 5,914,517
[45] Date of Patent: Jun. 22, 1999

[54] TRENCH-ISOLATION TYPE SEMICONDUCTOR DEVICE

[75] Inventor: Hidekazu Konogi, Tokyo, Japan

[73] Assignee: Nippon Steel Corporation, Tokyo, Japan

[21] Appl. No.: 08/853,943

[22] Filed: May 9, 1997

[30] Foreign Application Priority Data

Jul. 16, 1996 [JP] Japan ................................. 8-205355

[51] Int. Cl.⁶ .......................... H01L 29/76; H01L 29/94
[52] U.S. Cl. .................... 257/374; 257/350; 257/351; 257/506; 257/508
[58] Field of Search ................................. 257/204, 350, 257/351, 374, 506, 508

[56] References Cited

U.S. PATENT DOCUMENTS

| | | | |
|---|---|---|---|
| 4,624,047 | 11/1986 | Tani | 29/576 |
| 5,225,707 | 7/1993 | Komaru et al. | 257/513 |
| 5,365,082 | 11/1994 | Gill et al. | 257/374 |

FOREIGN PATENT DOCUMENTS

| | | |
|---|---|---|
| A-61-61430 | 3/1986 | Japan . |
| A-61-61433 | 3/1986 | Japan . |
| A-61-168241 | 7/1986 | Japan . |
| A-1-245539 | 9/1989 | Japan . |

OTHER PUBLICATIONS

Gilbert et al., Latch-up Performance of a Sub-0.5 Micron Inter-well Deep Trench Technology, IEDM 1993, pp. 731–734.

*Primary Examiner*—Valencia Martin-Wallace
*Attorney, Agent, or Firm*—Pollock, Vande Sande & Amernick

[57] ABSTRACT

A semiconductor device and a method of manufacturing the same. The semiconductor device comprises: a semiconductor substrate; an impurity injection layer formed in a surface of the semiconductor substrate; and a trench formed in the impurity injection layer for defining a plurality of element formation regions isolated one another by the trench, wherein the impurity injection layer extends to a depth inside the semiconductor substrate deeper at a first area below the trench than at a second area below each of the element formation regions.

12 Claims, 1 Drawing Sheet

TRENCH-ISOLATION TYPE SEMICONDUCTOR DEVICE

BACKGROUND OF THE INVENTION

1. Field of the Invention

This invention relates to a trench-isolation type semiconductor device and to a method of manufacturing the same.

2. Description of the Related Art

To miniaturize a semiconductor device and to improve its reliability, a trench-isolation type semiconductor device is known in which a trench is formed in the surface of a semiconductor substrate, and filled with an insulating material thereby isolating an element active region by the trench, as described, for example, in JP-A-61-61430, JP-A-61-61433, JP-A-61-168241, "Latch-Up Performance of a Sub-0.5 Micron Inter-well Deep Trench Technology" by V. Gilbert, et al, IEDM 1993, p.p. 731 to 734, and so forth.

When an N-type MOS LSI is formed by the trench-isolation system in the prior art, an oxide film having a predetermined thickness is first formed on the surface of a semiconductor substrate and a P-type impurity is then introduced into the substrate by ion implantation to form a P-type impurity injection layer below the oxide film of the surface of the semiconductor substrate.

Next, after the oxide film is removed by wet etching, the impurity injection layer is annealed at a high temperature for a predetermined time to be diffused into the substrate thereby to form a P-type impurity diffusion layer (which is referred to a "well") having an impurity concentration of up to about $10^{16}$ ions/cm$^3$. Then, a resist pattern is formed and etching is carried out to form a trench having a predetermined pattern so as to form element forming regions isolated by the trench in the P well. Circuit elements such as N transistors, capacitors, etc, are formed in these element forming regions.

As described above, the P well is first formed and then the trench is formed. Therefore, when the well is shallower than the trench, the well disposed between adjacent element formation regions may be divided by the trench. When the impurity type of the substrate wafer is different from that of the well and the well disposed between the element formation regions is divided by the trench, a contact for forming the connection for keeping the divided wells at the same potential must be disposed in each well, involving a problem in that the area of the semiconductor device increases.

Therefore, the well is generally provided with a sufficient depth in order to prevent it from being divided by the trench. The depth of the trench is generally about 0.5 μm whereas the depth of the well is 2 to 4 μm. When it is required to further increase the depth of the trench, however, the well must be formed with a greater depth to prevent it from being divided by the trench. For this reason, high temperature annealing or high energy ion implantation must be carried out after ion implantation for a longer time than usual. However, these treatments involve a problem of the thermal strain resulting from high temperature heat-treatment or the crystal defect derived from higher energy, thus resulting in deterioration of the device characteristics.

According to the prior art described above, the well is first formed in the semiconductor substrate and then the trench is formed. In contrast, JP-A-1-245539 proposes a method in which the trench is first formed in the semiconductor substrate, then the trench is filled with an insulating layer and the impurity injection layer is formed by implanting an impurity into the region isolated by the trench. According to this method, the well is not divided by the trench but because the impurity is implanted after the trench is filled with the insulating film, impurity implantation energy of higher level is required. In consequence, damages occurring in the surface of the semiconductor substrate become great.

SUMMARY OF THE INVENTION

It is a main object of the present invention to provide a semiconductor device having element forming regions isolated by a trench in a well formed in the surface of a semiconductor substrate, in which the well is prevented from being divided by the trench and the semiconductor substrate is less damaged by impurity implantation energy at the time of formation of the well thereby solving the problem of the prior art described above. The purpose of the invention is also to provide a method of manufacturing such a semiconductor device.

According to one aspect of the present invention, a semiconductor device is provided including a semiconductor substrate; an impurity injection layer formed in a surface of the semiconductor substrate; and a trench formed in the impurity injection layer for defining a plurality of element formation regions isolated from one another by the trench; wherein the impurity injection layer extends to a depth inside the semiconductor substrate which is deeper at a first area below the trench than at a second area below each of the element formation regions.

According to another aspect of the present invention, there is provided a method of manufacturing a semiconductor device which comprises the steps of forming a trench in a semiconductor substrate for element isolation in such a manner as to define at least one predetermined element formation region isolated by the trench; injecting an impurity into the semiconductor substrate having the trench formed therein by ion implantation; and diffusing the impurity so injected into the semiconductor substrate.

According to a preferred embodiment of the present invention, the impurity described above is preferably injected by an inclined rotating ion-implantation at an angle in a range of 60° to 83° into the surface of the semiconductor substrate.

DESCRIPTION OF THE PREFERRED EMBODIMENTS

A method of manufacturing a semiconductor device according to the first embodiment of the present invention will be explained with reference to FIGS. 1A to 1D. This embodiment represents the case where the present invention is applied to an N-type semiconductor substrate.

Figure 1A:
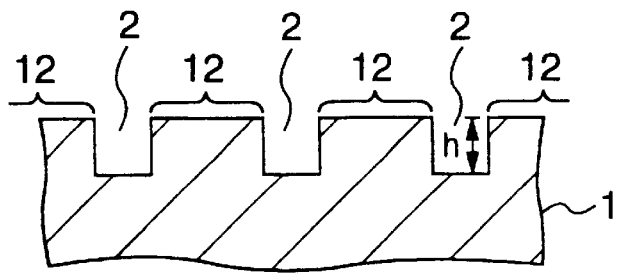
FIGS. 1A to 1D are sectional views for explaining respective steps of a method of manufacturing a semiconductor device according to a first embodiment of the present invention.

First, a resist pattern (not shown) is formed on the surface of an N-type semiconductor substrate by known photolithography technology as shown in FIG. 1A, and a trench 2 is then formed by etching the semiconductor substrate 1. The resist pattern is thereafter removed. The trench 2 is formed in a pattern such that a plurality of element formation regions 12 isolated from one another by the trench 2 are defined in the semiconductor substrate.

Figure 1B:
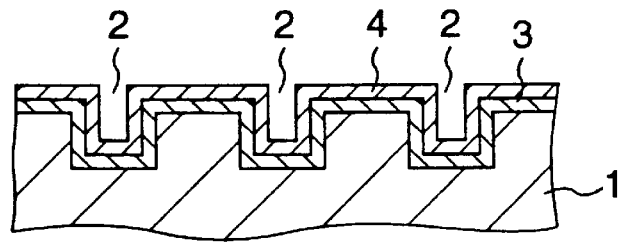
Figure 2:
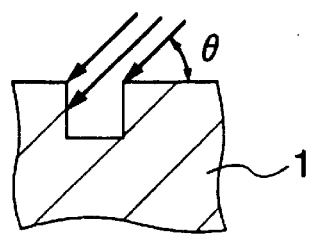
FIG. 2 is a diagram for explaining the angle of ion injection of impurity ions.

Next, as shown in FIG. 1B, an oxide film 4 is formed on the surface of the semiconductor substrate 1 at a film thickness of about 100 nm by a thermal oxidation process. A P-type impurity such as boron is then introduced by a known inclined rotating ion implantation method to form a P-type impurity injection layer 3. Under the ion implantation condition such that an acceleration voltage is 60 to 80 keV and a dose rate is $1.0 \times 10^{13}$ ions cm$^{-2}$, the inclined rotating ion implantation is carried out at an angle θ of 60 to 83° with respect to the surface of the semiconductor substrate 1 as shown in FIG. 2.

Figure 1C:
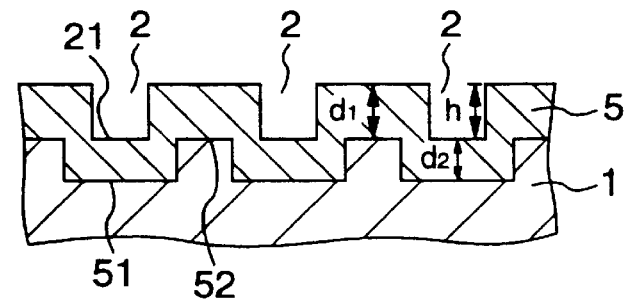

After the oxide film 4 is removed by known wet etching as shown in FIG. 1C, annealing is carried out at about 1,100° C. for a predetermined time to form a P well 5 into which the impurity is diffused. The boundary 51 of the P well 5 below the trench 2 is deeper than its boundary 52 disposed at the element formation region 12. When the depth h of the trench 2 is 0.2 to 0.7 μm, for example, the boundary 51 of the P well 5 below the trench is at a distance d2 of at least 0.2 μm from the bottom surface 21 of the trench, and the boundary 52 disposed at the element formation region 12 is at a distance d1 of more than 0.5 μm from the surface of the substrate. Generally, the boundary disposed below the trench is at a position deeper than the boundary 52 disposed at the element formation region.

Figure 1D:
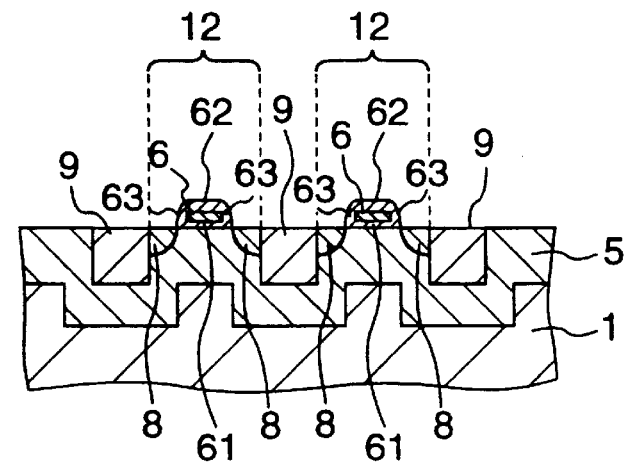

Next, an oxide film 9 is deposited on the entire surface of the semiconductor substrate 1 by chemical vapor deposition as shown in FIG. 1D. Next, the oxide film 9 is polished by chemimechanical polishing to remove the oxide film at a portion other than its portion filled into the trench thereby filling the trench by the oxide film. The semiconductor substrate 1 is then oxidized thermally to form a gate oxide film 61 over the surface of the substrate. After a polycrystalline silicon film 6 and an insulating film 62 are successively deposited on the entire surface of the semiconductor substrate 1, the polycrystalline silicon film 6 and the insulating film 62 are patterned by photolithography. Furthermore, an insulating film 63 is deposited to the entire surface of the semiconductor substrate 1, and etched back to form sidewalls 63. Thus, a gate electrode 6 of a transistor is formed in each active region 12. Then, ion implantation and annealing are carried out to form an n$^+$ type impurity diffusion layer 8.

As described above, the present invention can prevent the well from being separated by the trench even when the relatively deep trench is formed in the trench isolation type semiconductor device.

I claim:

1. A semiconductor device comprising:

a semiconductor substrate;

an impurity injection layer formed in a surface of said semiconductor substrate; and a trench formed in said impurity injection layer for defining a plurality of element formation regions isolated from one another by said trench; and wherein said impurity injection layer extends to a depth inside said semiconductor substrate which is deeper at a first area below said trench than at a second area below each of said element formation regions.

2. A semiconductor device according to claim 1, wherein said trench extends to a depth of 0.4 to 0.7 μm and said impurity injection layer extends to a depth deeper than 0.2 μm from a bottom of said trench at the first area below said trench and to a depth of 0.5 μm from the surface of said semiconductor substrate at the second area below each of said element formation regions.

3. A semiconductor device according to claim 1, further comprising an insulating film filled within said trench.

4. A semiconductor device according to claim 3, wherein said insulating film includes an oxide film.

5. A semiconductor device according to claim 1, further comprising a transistor formed in each of said element formation regions.

6. A semiconductor device according to claim 1, wherein said impurity injection layer is of a P-type.

7. A semiconductor device comprising:

an impurity injection layer formed in a surface of a semiconductor substrate; and a trench formed in said impurity injection layer for defining a plurality of element formation regions isolated from one another by said trench; and wherein a sum of a depth of said trench and a depth of said impurity injection layer inside said semiconductor substrate measured from a bottom of said trench is greater than a depth of said impurity injection layer inside said semiconductor substrate in each of said element formation regions measured from the surface of said semiconductor substrate.

8. A semiconductor device according to claim 7, wherein the depth of said trench is 0.4 to 0.7 μm and said impurity injection layer extends inside said semiconductor substrate to a depth of 0.2 μm or more at a first area below said trench and to a depth of 0.5 μm or more at a second area below each of said element formation regions.

9. A semiconductor device according to claim 7, further comprising an insulating film so formed as to fill said trench.

10. A semiconductor device according to claim 9, wherein said insulating film includes an oxide film.

11. A semiconductor device according to claim 7, further comprising a transistor formed in each of said element formation regions.

12. A semiconductor device according to claim 7, wherein said impurity injection layer is of a P-type.

* * * * *